(12) United States Patent
Zhu

(10) Patent No.: US 12,426,181 B2
(45) Date of Patent: Sep. 23, 2025

(54) BLACKLIGHT MODULE AND ELECTRONIC DEVICE

(71) Applicant: WUHAN CHINA STAR OPTOELECTRONICS TECHNOLOGY CO., LTD., Hubei (CN)

(72) Inventor: Lei Zhu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/617,512

(22) PCT Filed: Nov. 24, 2021

(86) PCT No.: PCT/CN2021/132716
§ 371 (c)(1),
(2) Date: May 25, 2023

(87) PCT Pub. No.: WO2023/087341
PCT Pub. Date: May 25, 2023

(65) Prior Publication Data
US 2024/0008204 A1  Jan. 4, 2024

(30) Foreign Application Priority Data
Nov. 18, 2021 (CN) .......................... 202111365632.4

(51) Int. Cl.
*H05K 5/02* (2006.01)
*H05K 5/00* (2006.01)
*H05K 5/10* (2025.01)

(52) U.S. Cl.
CPC ......... *H05K 5/0247* (2013.01); *H05K 5/0018* (2022.08); *H05K 5/0069* (2013.01); *H05K 5/0217* (2013.01); *H05K 5/10* (2025.01)

(58) Field of Classification Search
None
See application file for complete search history.

(56) References Cited

U.S. PATENT DOCUMENTS 10,139,555 B2 * 11/2018 Wang .................... G02B 6/0088
10,222,837 B1 *  3/2019 Budinich .............. G06F 1/1656
(Continued)

FOREIGN PATENT DOCUMENTS

CN   201462493 U   5/2010
CN   203444197 U   2/2014
(Continued)

OTHER PUBLICATIONS

Chinese Office Action issued in corresponding Chinese Patent Application No. 202111365632.4 dated Jun. 16, 2022, pp. 1-10.
(Continued)

*Primary Examiner* — Xanthia C Relford
(74) *Attorney, Agent, or Firm* — PV IP PC; Wei Te Chung

(57) ABSTRACT

A backlight module and an electronic device are provided. The electronic device includes a display panel and a backlight module. The backlight module includes an outer frame and an inner frame. The inner frame is disposed inside the outer frame. The outer frame is provided with a positioning portion. A fastening portion is formed on an outer wall of the inner frame. A cross-section of the positioning portion does not directly contact the fastening portion, which can avoid the wear of the fastening portion caused by the cross-section of the positioning portion and reduce a debris generated by the friction between the outer frame and the inner frame at
(Continued)

a snap-fit engagement position of the fastening portion and the positioning portion.

20 Claims, 7 Drawing Sheets

(56) References Cited

U.S. PATENT DOCUMENTS

| | | | | |
|---|---|---|---|---|
| 10,996,392 | B2* | 5/2021 | Li | G02B 6/0088 |
| 11,202,381 | B2* | 12/2021 | Miyake | H05K 5/15 |
| 11,558,972 | B2* | 1/2023 | Salayandia | B60R 16/0239 |
| 11,991,842 | B2* | 5/2024 | Xu | G09F 9/3026 |
| 2013/0070401 | A1* | 3/2013 | Arheit | G02F 1/133308 |
| | | | | 361/679.01 |
| 2014/0055708 | A1* | 2/2014 | Yu | G02F 1/133308 |
| | | | | 349/58 |
| 2015/0055053 | A1* | 2/2015 | Sasaoka | G02F 1/1336 |
| | | | | 349/58 |
| 2016/0004007 | A1* | 1/2016 | Chen | G02F 1/1336 |
| | | | | 362/606 |
| 2016/0213173 | A1* | 7/2016 | Xu | G02F 1/133308 |
| 2019/0064576 | A1* | 2/2019 | Sun | G02F 1/133308 |
| 2019/0243412 | A1* | 8/2019 | Siddiqui | G06F 1/1601 |
| 2020/0103706 | A1 | 4/2020 | Li et al. | |
| 2020/0124903 | A1* | 4/2020 | Yang | G02F 1/133308 |
| 2020/0341187 | A1* | 10/2020 | Li | G02F 1/133328 |
| 2022/0155515 | A1* | 5/2022 | Fu | G02B 6/002 |

FOREIGN PATENT DOCUMENTS

| | | |
|---|---|---|
| CN | 103697416 A | 4/2014 |
| CN | 105068318 A | 11/2015 |
| CN | 206710753 U | 12/2017 |
| CN | 207264061 U | 4/2018 |
| CN | 208000440 U | 10/2018 |
| CN | 209842279 U | 12/2019 |
| CN | 211149136 U | 7/2020 |
| CN | 213755340 U | 7/2021 |
| CN | 113359351 A | 9/2021 |
| JP | 2001154173 A | 6/2001 |
| JP | 2010237548 A | 10/2010 |
| WO | 2014042061 A1 | 3/2014 |

OTHER PUBLICATIONS

International Search Report in International application No. PCT/CN2021/132716, mailed on Apr. 25, 2022.
Written Opinion of the International Searching Authority in International application No. PCT/CN2021/132716, mailed on Apr. 25, 2022.

* cited by examiner

1

BLACKLIGHT MODULE AND ELECTRONIC DEVICE

FIELD OF INVENTION

The present disclosure relates to the technical field of display, and particularly, to a backlight module and an electronic device.

BACKGROUND OF INVENTION

A backlight module of an electronic device is usually designed as a glue-iron separation type. A recess is formed at a snap-fit position of an outer frame, and a protrusion is formed at a snap-fit position of an inner frame. After the outer frame and the inner frame are formed separately, the snap-fit engagement is performed manually.

Technical Problems

The outer frame is usually made of a metal material, and the inner frame is made of a flexible material, such as rubber. A hardness of the inner frame is less than a hardness of the outer frame. In a process of manual snap-fitting engagement, the contact between the protrusion of the inner frame and a cross-section of the outer frame at a snap-fit position may easily cause a surface of the inner frame to be scratched and produce debris. During the transportation of a finished product of the backlight module, since the inner frame and the outer frame cannot be completely fixed through the snap-fit engagement, the inner frame constantly rubs against the outer frame, thereby generating the debris due to surface abrasion. If the debris caused by the abrasion between the inner frame and the outer frame falls into the backlight module, a white spot of a foreign matter may appear on a display screen of the electronic device.

In summary, the conventional backlight module has the problem that the inner frame and the outer frame may rub at the snap-fit position, thereby generating the debris. Therefore, it is necessary to provide a backlight module and an electronic device to improve such a defect.

SUMMARY OF INVENTION

The present disclosure provides a backlight module and an electronic device to solve the problem existing in a conventional blacklight module that the inner frame and the outer frame may rub at a snap-fit position, thereby generating debris.

The backlight module comprises:
an outer frame having a positioning portion, and
an inner frame disposed inside the outer frame, wherein a fastening portion is formed on an outer wall of the inner frame, and the fastening portion is in snap-fit engagement with the positioning portion, and
wherein the positioning portion has a cross-section, and the cross-section does not directly contact the fastening portion.

According to one embodiment of the present disclosure, the outer frame comprises a lateral frame and a bottom frame, and the lateral frame is disposed on an outer periphery of the bottom frame. The positioning portion has a positioning recess. The cross-section is formed on the lateral frame. The positioning recess is at least formed on the lateral frame. The fastening portion is in snap-fit engagement with into the positioning recess.

According to one embodiment of the present disclosure, the positioning portion has a bending portion. The fastening portion has a first fitting surface. The first fitting surface faces an outer wall of the bending portion. The cross-section connects the outer wall of the bending portion.

According to one embodiment of the present disclosure, the first fitting surface is perpendicular to a thickness direction of the backlight module, and the cross-section is perpendicular to the first fitting surface.

According to one embodiment of the present disclosure, the first fitting surface is perpendicular to a thickness direction of the backlight module, and the cross-section is away from the first fitting surface and is parallel to the first fitting surface.

According to one embodiment of the present disclosure, the fastening portion has a first fitting surface. The cross-section faces the first fitting surface. One side of the first fitting surface close to the cross-section is provided with a first protective member.

According to one embodiment of the present disclosure, a hardness of the outer frame is greater than a hardness of the inner frame, and a hardness of the first protective member is same as the hardness of the outer frame.

According to one embodiment of the present disclosure, the inner frame and the first protective member are formed integrally.

According to one embodiment of the present disclosure, the fastening portion has a first fitting surface. The cross-section faces the first fitting surface. One side of the first fitting surface close to the cross-section is provided with a second protective member.

According to one embodiment of the present disclosure, a hardness of the outer frame is greater than a hardness of the inner frame, and a hardness of the second protective member is less than or equal to the hardness of the outer frame.

According to one embodiment of the present disclosure, the positioning recess is formed at a junction of the lateral frame and the bottom frame. The positioning portion has a second fitting surface formed on the bottom frame. The fastening portion has a third fitting surface facing the second fitting surface, and both the second fitting surface and the third fitting surface are parallel to a thickness direction of the backlight module.

According to one embodiment of the present disclosure, the lateral frame comprises:
a first side-portion connected to the bottom frame, wherein the positioning recess is formed at a junction of the first side-portion and the bottom frame,
a second side-portion disposed on an outer periphery of the first side-portion, and
a connecting portion used to connect the first side-portion and the second side-portion, wherein the connecting portion is disposed at one end of the first-lateral portion and the second side-portion away from the bottom frame.

The present disclosure further provides an electronic device. The electronic device comprises a display panel and a backlight module. The display panel is disposed on the backlight module, and the backlight module comprises:
an outer frame having a positioning portion, and
an inner frame disposed inside the outer frame, wherein a fastening portion is formed on an outer wall of the inner frame, and the fastening portion is in snap-fit engagement with the positioning portion, and
wherein the positioning portion has a cross-section, and the cross-section does not directly contact the fastening portion.

According to one embodiment of the present disclosure, the outer frame comprises a lateral frame and a bottom frame. The lateral frame is disposed on an outer periphery of the bottom frame. The positioning portion has a positioning recess. The cross-section is formed on the lateral frame. The positioning recess is at least formed on the lateral frame. The fastening portion is in snap-fit engagement with into the positioning recess.

According to one embodiment of the present disclosure, the positioning portion has a bending portion. The fastening portion has a first fitting surface. The first fitting surface faces an outer wall of the bending portion. The cross-section connects the outer wall of the bending portion.

According to one embodiment of the present disclosure, the first fitting surface is perpendicular to a thickness direction of the backlight module, and the cross-section is perpendicular to the first fitting surface.

According to one embodiment of the present disclosure, the first fitting surface is perpendicular to a thickness direction of the backlight module, and the cross-section is away from the first fitting surface and is parallel to the first fitting surface.

According to one embodiment of the present disclosure, the fastening portion has a first fitting surface. The cross-section faces the first fitting surface. One side of the first fitting surface close to the cross-section is provided with a first protective member.

According to one embodiment of the present disclosure, a hardness of the outer frame is greater than a hardness of the inner frame, and a hardness of the first protective member is same as the hardness of the outer frame.

According to one embodiment of the present disclosure, the inner frame and the first protective member are formed integrally.

Beneficial Effects:

The beneficial effects of the embodiments of the present disclosure are as follows: the present disclosure discloses a backlight module and an electronic device. The electronic device comprises a display panel and a backlight module. The backlight module comprises an outer frame and an inner frame. The inner frame is disposed inside the outer frame. The outer frame is provided with a positioning portion. A fastening portion is formed on an outer wall of the inner frame. A cross-section of the positioning portion does not directly contact the fastening portion, which may avoid the abrasion of the fastening portion caused by the cross-section of the positioning portion and reduce debris caused by the abrasion between the outer frame and the inner frame at a snap-fit position of the fastening portion and the positioning portion, thereby solving the problem existing in the conventional blacklight module that the inner frame and the outer frame may rub at a snap-fit position, thereby generating the debris.

BRIEF DESCRIPTION OF DRAWINGS

In order to explain the technical solutions of the present disclosure more clearly, the following will briefly introduce the drawings used in the description of the embodiments or the related art. Obviously, the drawings described below are only some embodiments of the present disclosure. For those skilled in the art, other drawings can be obtained based on these drawings without making creative efforts.

DETAILED DESCRIPTION OF PREFERRED EMBODIMENTS

Figure 1:
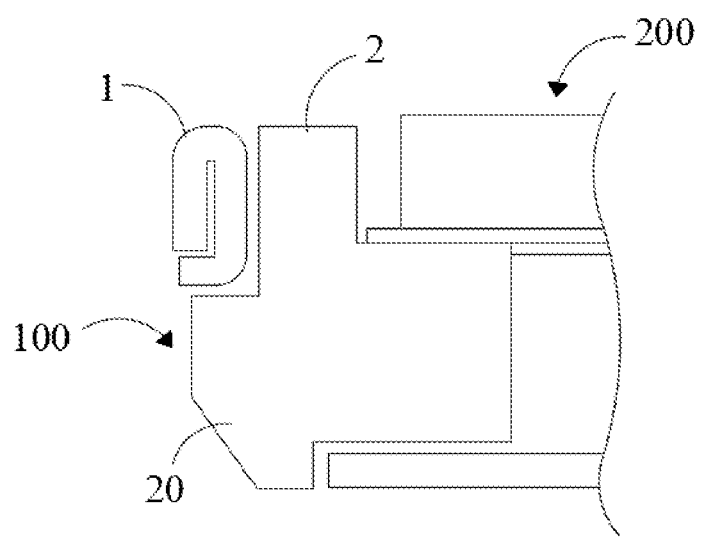
FIG. 1 is a schematic structural view of an electronic device provided by an embodiment of the present disclosure.

The description of the following embodiments refers to the attached drawings to illustrate specific embodiments that can be implemented by the present disclosure. The directional terms mentioned in the present disclosure, such as "top", "bottom", "front", "rear", "left", "right", "inside", "outside", "lateral side", etc. merely refer to the direction of the attached drawings. Therefore, the directional terms used are used to illustrate and understand the present disclosure, rather than to limit the present disclosure. In the drawings, the units with similar structure are indicated by the same reference numerals.

The present disclosure will be further described below with the drawings and specific embodiments.

An embodiment of the present disclosure provides a backlight module and an electronic device. As shown in FIG. 1, FIG. 1 is a schematic structural view of the electronic device. The electronic device 1000 comprises the backlight module 100, a display panel 200, and a housing (not shown in the figure). The display panel 200 is disposed on the backlight module 100, and the display panel 200 and the backlight module 100 may be disposed in the housing. The housing may be provided with an accommodation space. The accommodation space may be used for placing a motherboard and a printed circuit board. A battery is used to drive the electronic components of the display panel 200 and the backlight module 100.

In the embodiment of the present disclosure, the electronic device may be a vehicle-mounted display terminal, such as a vehicle-mounted display, a driving recorder, etc. The electronic device may also be a mobile terminal, such as a smart phone, a tablet computer, a notebook computer, etc., or a wearable-type terminal, such as a smart watch, a smart bracelet, smart glasses, an enhanced implement device, etc. The electronic device may also be a fixed terminal, such as a desktop computer, a television, etc., or a vehicle-mounted display terminal, such as a vehicle-mounted display or a driving recorder, etc.

Figure 2:
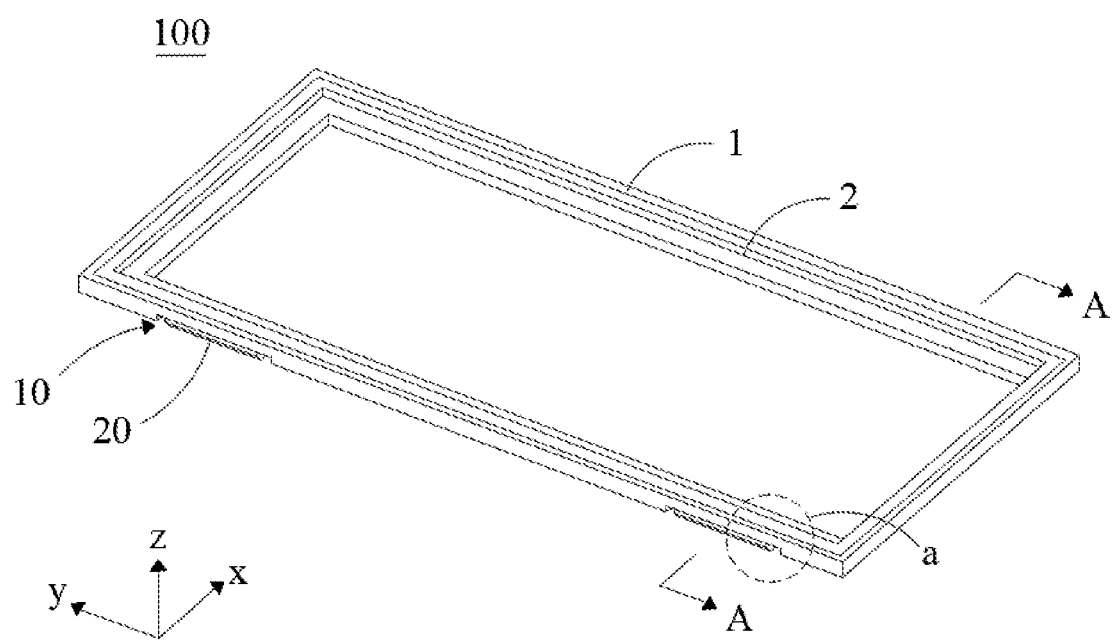
FIG. 2 is a schematic structural view of a backlight module provided by an embodiment of the present disclosure.
Figure 3:
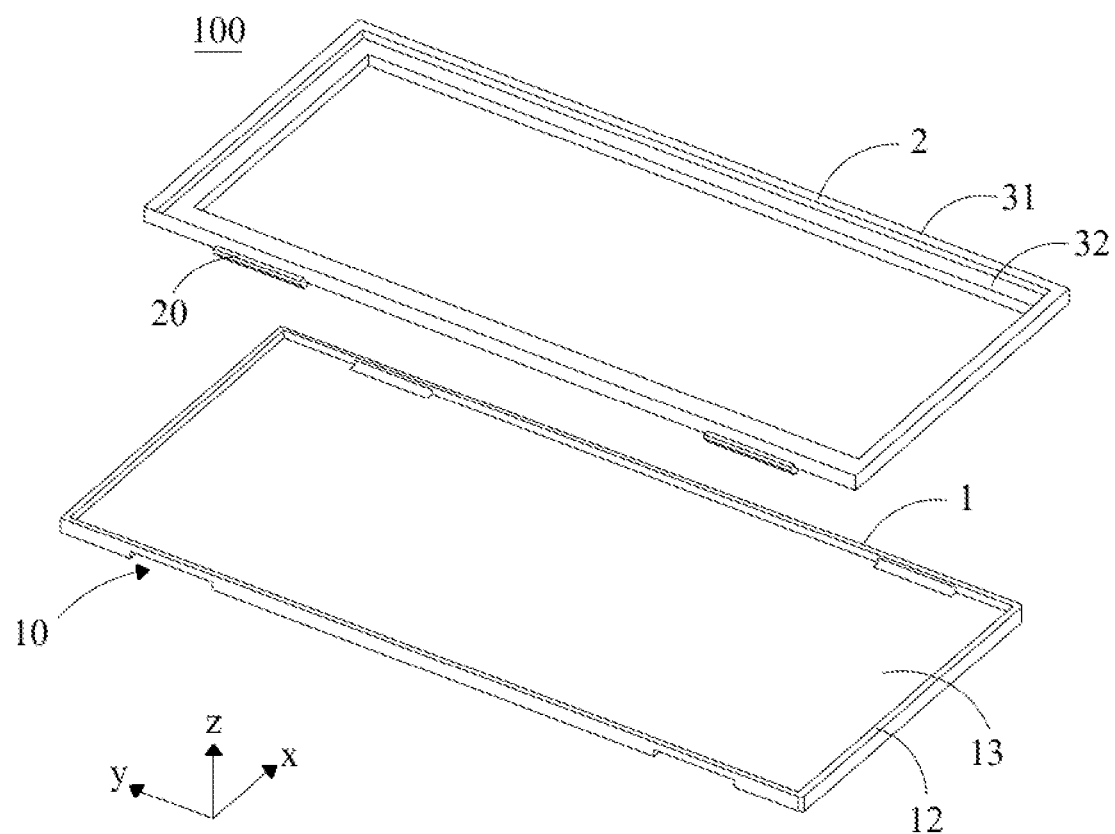
FIG. 3 is an exploded schematic view of the backlight module provided by an embodiment of the present disclosure.

As shown in FIG. 2 to FIG. 3, FIG. 2 is a schematic structural view of the backlight module provided by an embodiment of the present disclosure, and FIG. 3 is an exploded schematic view of the backlight module provided by an embodiment of the present disclosure. The backlight module 100 comprises an outer frame 1 and the inner frame 2. The inner frame 2 is disposed inside the outer frame 1. The outer frame 1 is provided with a positioning portion 10. An outer wall of the inner frame 2 is integrally formed with a fastening portion 20, and the fastening portion 20 is in snap-fit engagement with the positioning portion 10 to fix the inner frame 2 to an inner side of the outer frame 1.

In one embodiment of the present disclosure, the inner frame 2 is made of an opaque rubber material. The inner side of the inner frame 2 is provided with a stepped surface to support the display panel 200. In a practical application, the material of the inner frame 2 is not limited to rubber and may also be made of a soft and opaque material such as plastic.

The outer frame 1 is made of stainless steel. The outer frame 1 may be used to place a light source and other components of the backlight module 100. On one hand, a thermal conductivity of a metal material may be used to radiate the heat of the light source, so that the backlight module 100 has a decent heat dissipation performance. On the other hand, a deformation resistance of the metal material may be used to ensure an overall rigidity of the backlight module 100, so as to prevent the backlight module 100 from deforming when subjected to an external force and causing internal optical components to be damaged. In a practical application, the material of the outer frame 1 is not limited to stainless steel described in the above embodiment and may be made of one or more other metal materials such as iron and aluminum.

As shown in FIG. 2 and FIG. 3, the inner frame 2 consists of four straight-sided inner frames connected end to end in sequence to form a ring structure, and the inner frame 2 is formed integrally. All of outer walls of the four straight-sided inner frames of the inner frame 2 may be provided with fastening portions 20. Alternatively, only the outer walls of two longer opposite inner frames of the inner frame 2 are provided with fastening portions 20. One or more fastening portions 20 may be provided on each inner frame, and each fastening portion 20 is provided with a corresponding positioning portion 10 on the outer frame 1.

Figure 4:
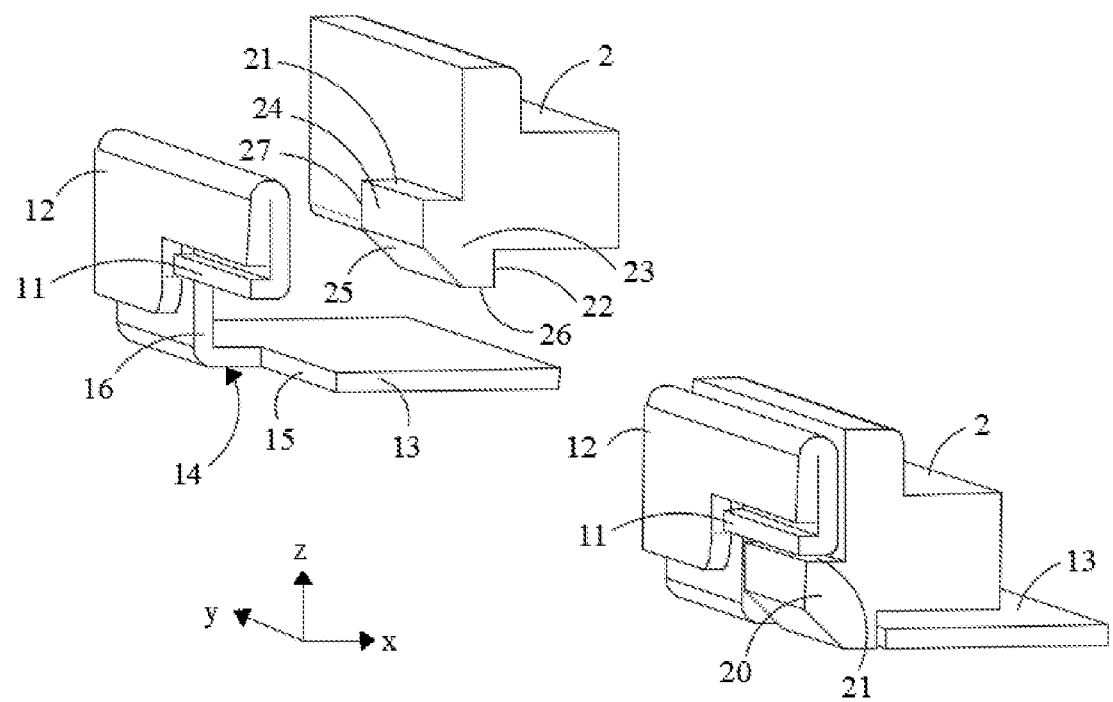
FIG. 4 is an enlarged schematic view of a first backlight module provided by an embodiment of the present disclosure.
Figure 5:
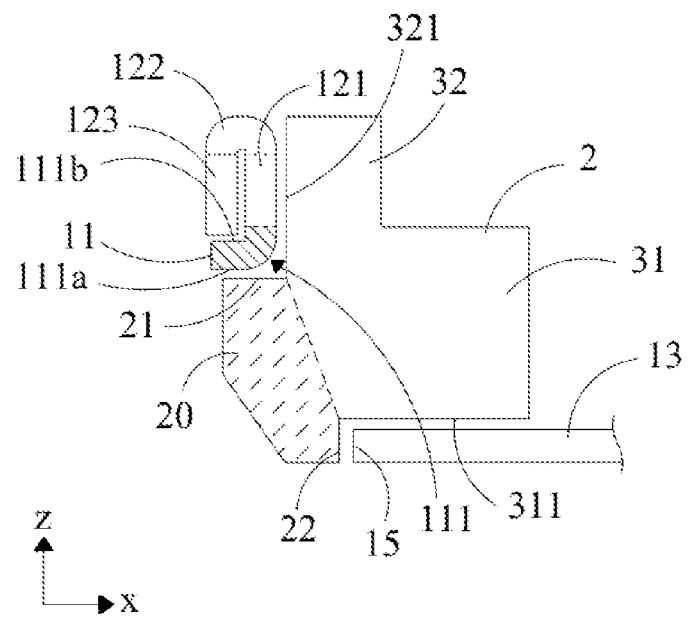
FIG. 5 is a partial cross-sectional schematic view of the first backlight module along a A-A direction provided by an embodiment of the present disclosure.

Please refer to FIG. 2 to FIG. 5. FIG. 4 is an enlarged schematic view of a first backlight module provided by an embodiment of the present disclosure. FIG. 5 is a partial cross-sectional schematic view of the first backlight module along a A-A direction provided by an embodiment of the present disclosure. The positioning portion 10 has a cross-section 11 formed by stamping, and the cross-section 11 of the positioning portion 10 does not directly contact the fastening portion 20.

It should be noted that the cross-section 11 of the positioning portion 10 is a cross-section formed in a stamping process of the outer frame 1. There are many small burrs on the cross-section 11, and the burrs may increase a surface roughness of the cross-section 11. Since a hardness of the outer frame 1 is greater than a hardness of the inner frame 2, when the cross-section 11 contacts and rubs against the fastening portion 20 of the inner frame 2, the burrs on a surface of the cross-section 11 will rub against the fastening portion 20 and generate debris. The cross-section 11 does not directly contact with the fastening portion 20, which may prevent the cross-section 11 of the positioning portion from abasing the fastening portion 20, thereby reducing the debris caused by the abrasion between the outer frame 1 and the inner frame 2 at a snap-fit position of the fastening portion 20 and the positioning portion 10.

Furthermore, as shown in FIG. 2 to FIG. 3, the outer frame 1 comprises a lateral frame 12 and a bottom frame 13. The lateral frame 12 is disposed on an outer periphery of the bottom frame 13. In the embodiment of the present disclosure, the lateral frame 12 is formed integrally with the bottom frame 13. The bottom frame 13 is parallel to a plane defined by a first direction x and a second direction y. The lateral frame 12 is formed by extending the four peripheral edges of the bottom frame 13 along a third direction z and is perpendicular to the plane defined by the first direction x and the second direction y. The third direction z is a direction along a thickness of the backlight module 100. The bottom frame 13 is used to place the light source and a light board of the backlight module 100. The inner frame 2 may be disposed on an inner periphery of the bottom frame 13 or an outer periphery of the light board.

As shown in FIG. 4, the positioning portion 10 has a positioning recess 14. The positioning recess 14 and the cross-section 11 are formed in the same stamping process. The cross-section 11 is formed on the lateral frame 12, and the positioning recess 14 is at least formed on the lateral frame 12.

In the embodiment of the present disclosure, the positioning recess 14 is a snap-fit engagement recess, and the positioning recess 14 penetrates the lateral frame 12. The fastening portion 20 is formed in a stepped shape, and the fastening portion 20 may be fitted into the positioning recess 14. The lateral frame 12 is formed with the cross-section 11 while lateral frame 12 is stamped to form the positioning recess 14.

As shown in FIG. 3, the inner frame 2 comprises an inner bottom frame 31 and an inner lateral frame 32. The inner frame 32 is disposed on an outer periphery of the inner bottom frame 31. The inner bottom frame 31 may be formed integrally with the inner frame 32. The inner bottom frame 31 is parallel to a plane defined by a first direction x and a second direction y. The inner lateral frame 32 is formed by extending the four peripheral edges of the inner bottom frame 31 in a third direction z. An area of the four peripheral edges of the inner bottom frame 31 has a stepped surface for supporting the display panel. A middle area of the inner bottom frame 31 is hollowed out to transmit light emitted from the light board.

The fastening portion 20 has a first fitting surface 21. The first fitting surface 21 is perpendicular to the backlight module 100 along a thickness direction of the backlight module 100, i.e. the third direction z shown in the figure. The first fitting surface 21 is connected to an outer wall 321 of the inner frame 32, and perpendicular to the outer wall 321 of the inner frame 32. The positioning portion 10 matches the first matching surface 21 to limit the movement of the inner frame 2 along the third direction z.

In one embodiment, as shown in FIG. 2 and FIG. 5, the positioning portion 10 has a bending portion 111. A shaded portion indicated by an arrow shown in FIG. 5 is the bending portion 111. The bending portion 111 has an outer wall 111a and an inner wall 111b disposed oppositely. The first fitting surface 21 of the fastening portion 20 faces the outer wall 111a of the bending portion 111.

It should be noted that when the outer frame 1 is formed, in order to prevent the outer frame 1 made of metal from being rusted, a coating is usually formed on an outer surface of the outer frame 1. The coating may not only prevent the frame 1 from rusting, but also reduce a roughness of the outer surface of the outer frame 1. The cross-section 11 formed while the positioning recess 14 is formed by stamping does not have the coating, but other outer surfaces of the outer frame 1, such as the outer wall 111a of the bending portion 111 still have the coating. It can be seen that the use of the outer wall 111a of the bending portion 111 with less roughness to fit the first fitting surface 21 of the fastening portion 20 may effectively reduce debris caused by the abrasion between the outer frame 1 and the inner frame 2 at a snap-fit position of the fastening portion 10 and the positioning portion 20.

In one embodiment, as shown in FIG. 4 and FIG. 5, the first fitting surface 21 is perpendicular to the backlight module 100 along a thickness direction of the backlight module 100. The cross-section 11 is perpendicular to the first fitting surface 21. A cross-sectional shape of the bending portion 111 in a plane defined by the second direction y and the third direction z is L-shaped. The cross-section 11 faces a side away from the inner frame 2, and the opposite ends of the cross-section 11 are respectively connected to the outer wall 111a and the inner wall 111b of the bending portion 111, so that it may prevent the cross-section 11 with burrs from directly contacting the first fitting surface 21, thereby avoid generating the debris caused by the abrasion between the first fitting surface 21 of the inner frame 2 and the outer frame 1 during a manual snap-fitting engagement process or a finished product transportation process.

Figure 6:
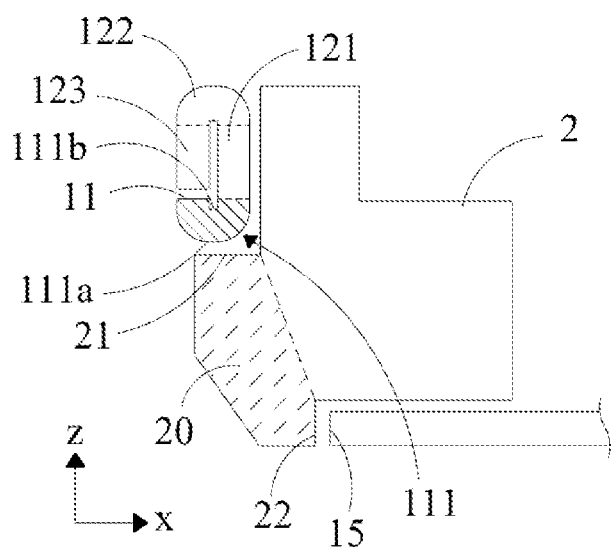
FIG. 6 is a partial cross-sectional schematic view of a second backlight module along a A-A direction provided by an embodiment of the present disclosure.

In one embodiment, as shown in FIG. 6, FIG. 6 is a partial cross-sectional schematic view of a second backlight module along a A-A direction provided by an embodiment of the present disclosure. The first fitting surface 21 is perpendicular to the backlight module 100 along a thickness direction of the backlight module 100. The cross-section 11 is away from the first fitting surface 21 and is parallel to the first fitting surface 21. A cross-sectional shape of the bending portion 111 in a plane defined by the second direction y and the third direction z is U-shaped. The opposite ends of the cross-section 11 are respectively connected to the outer wall 111a and the inner wall 111b of the bending portion 111, so that it may prevent the cross-section 11 with burrs from directly contacting the first fitting surface 21, thereby avoid generating the debris caused by the abrasion between the first fitting surface 21 of the inner frame 2 and the outer frame 1 during a manual snap-fitting engagement process or a finished product transportation process.

In one embodiment, the cross-section 11 faces the first fitting surface 21. A first protective member 4 is provided on one side of the first fitting surface 21 close to the cross-section 11.

Figure 7:
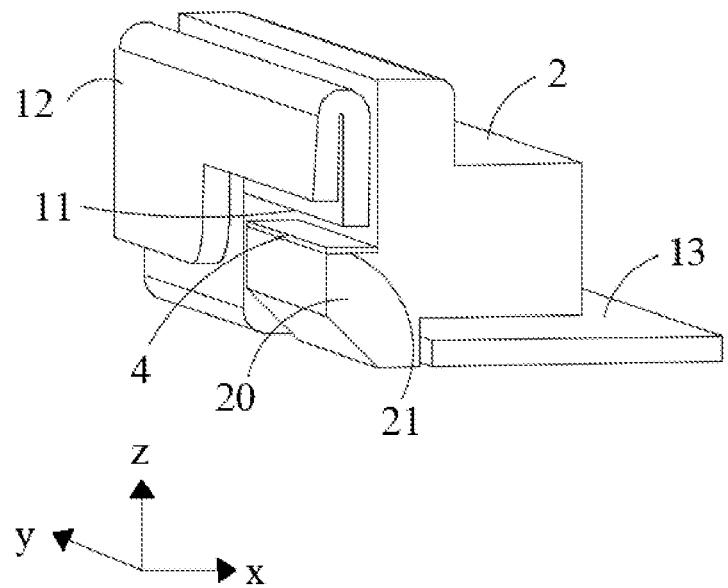
FIG. 7 is an enlarged schematic view of a third backlight module provided by an embodiment of the present disclosure.
Figure 8:
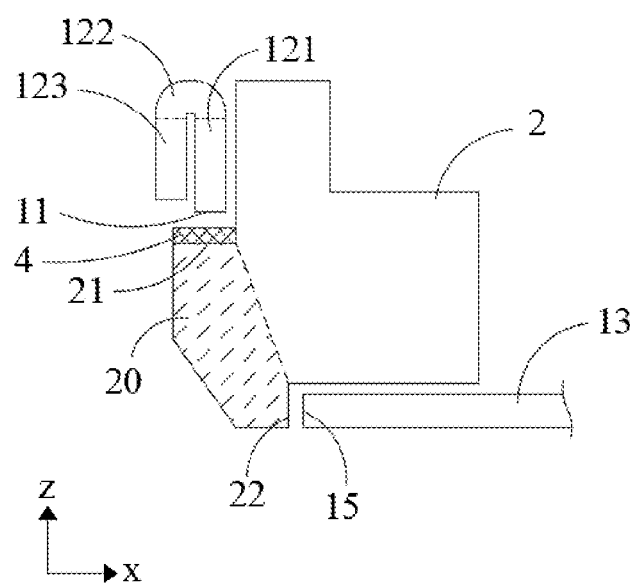
FIG. 8 is a partial cross-sectional schematic view of the third backlight module along a A-A direction provided by an embodiment of the present disclosure.

As shown in FIG. 7 to FIG. 8, FIG. 7 is an enlarged schematic view of a third backlight module provided by an embodiment of the present disclosure. FIG. 8 is a partial cross-sectional schematic view of the third backlight module along a A-A direction provided by an embodiment of the present disclosure. The cross-section 11 of the positioning portion 10 faces the first fitting surface 21 of the fastening portion 20, and both the cross-section 11 and the first fitting surface 21 are perpendicular to the backlight module 100 along a thickness direction of the backlight module 100. The first protective member 4 is laid on the surface of the first fitting surface 21. The cross-section 11 matches the first protective member 4. The first protective member 4 may separate the cross-section 11 from the first fitting surface 21 to avoid direct contact between cross-section 11 and first fitting surface 21 and prevent the burrs of the cross-section 11 from rubbing against the first fitting surface 21, thereby reducing the debris caused by the abrasion between the outer frame 1 and the inner frame 2 at the snap-fit position.

Further, a hardness of the first protective member 4 is the same as a hardness of the outer frame 1. It can be understood that if the hardness of the first protective member 4 and the hardness of the outer frame 1 are different, the abrasion between the first protective member 4 and the outer frame 1 at the snap-fit position may also generate the debris. If the hardness of the first protective member 4 and the hardness of the outer frame 1 are the same or similar, the wear caused by the abrasion between the first protective member 4 and the outer frame 1 may be minimized, thereby avoiding the abrasion between the first protective part 4 and the outer frame 1 to generate the debris.

Specifically, a material of the first protective member 4 is the same as a material of the outer frame 1. The first material of the protective member 4 may be a steel sheet made of stainless steel, which may prevent the first protective member 4 from rubbing against the outer frame 1 to generate debris. In a practical application, the material of the first protective member 4 is not limited to the stainless steel as described above, but may also be other metal materials such as aluminum and iron. The material of the first protective member 4 and the material of the outer frame 1 may be the same or different. It is only necessary to make the hardness of the first protective member 4 and the hardness of the outer frame 1 similar to each other.

The inner frame 2 is formed integrally with the first protective member 4. In a practical process of forming the inner frame 2, the first protective member 4 may be formed first. The first protective member 4 then is placed in a mold of the inner frame 2, and the inner frame 2 is formed by an injection molding process, so that a process of bonding the first protective member 4 and the inner frame 2 may be omitted, and a manufacturing process of the backlight module 100 may be simplified, thereby reducing the difficulty of assembling the backlight module 100. In a practical application, the first protective member 4 may also be attached to the first fitting surface 21 by bonding.

In an embodiment, the cross-section 11 opposites the first fitting surface 21, and a second protective member 5 is provided on one side of the cross-section 11 close to the first fitting surface 21.

Figure 9:
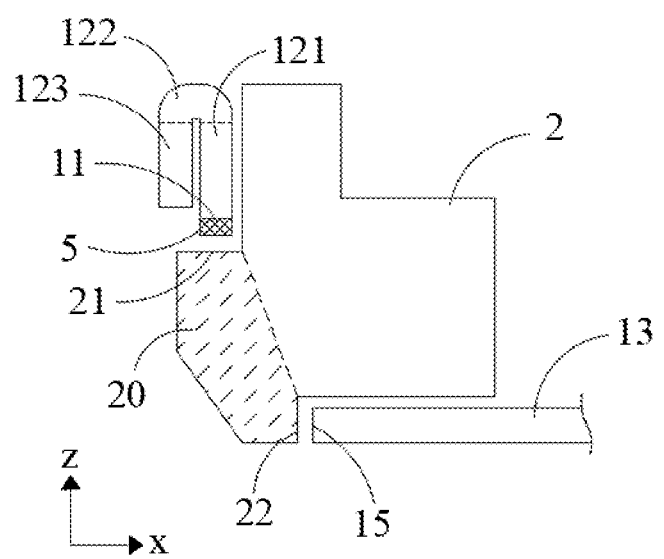
FIG. 9 is a partial cross-sectional schematic view of a fourth backlight module along a A-A direction provided by an embodiment of the present disclosure.

As shown in FIG. 9, FIG. 9 is a partial cross-sectional schematic view of a fourth backlight module along a A-A direction provided by an embodiment of the present disclosure. The cross-section 11 of the positioning portion 10 faces the first fitting surface 21 of the fastening portion 20, and both the cross-section 11 and the first fitting surface 21 are perpendicular to the backlight module 100 along a thickness direction of the backlight module 100. The second protective member 5 is laid on the cross-section 11. The first fitting surface 21 of the fastening portion 20 matches the second protective member 5. The cross-section 11 may be separated from the first fitting surface 21 by the second protective member 5 which covers the burrs on the surface of the cross-section 11 to avoid direct contact between cross-section 11 and first fitting surface 21 and prevent the burrs of the cross-section 11 from rubbing against the first fitting surface 21, thereby reducing the debris caused by the abrasion between the outer frame 1 and the inner frame 2 at a snap-fit position.

In an embodiment, a hardness of the second protective member 5 should be less than or equal to a hardness of the inner frame 2. The second protective member 5 with less hardness is used to cover the burrs on the surface of the cross-section 11. Moreover, it may also prevent the second protective member 5 from causing abrasion to the inner frame 2.

Specifically, the second protective member 5 may be a light-shielding adhesive. By directly applying the light-shielding adhesive on the cross-section 11 of the positioning portion 10, the light-shielding adhesive may be used to cover the burrs on the surface of the cross-section 11, thereby reducing the surface roughness of the cross-section 11. Moreover, the light-shielding adhesive is a flexible material, so that it may not abase the first fitting surface 21 of the fastening portion 20. In a practical application, the second protective member 5 is not limited to the light-shielding adhesive described above. The second protective member 5 may also be a single-sided foam adhesive. A sticky side of the single-sided foam adhesive may be pasted on one side of the section 11 close to the first fitting surface. 21, so that the same protection effect as the light-shielding adhesive may be achieved.

As shown in FIG. 4 to FIG. 8, the positioning recess 14 is formed at a junction of the lateral frame 12 and the bottom frame 13. The positioning portion 10 has a second fitting surface 15 formed on the bottom frame 13, and the fastening portion 20 has a third fitting surface 22 which matches the second fitting surface. The second fitting surface 15 and the third fitting surface 22 are both parallel to the backlight module 100 along a thickness direction of the backlight module 100, and the third fitting surface 22 is connected to a bottom surface 311 of the inner bottom frame 31.

The second fitting surface 15 faces the third fitting surface 22 of the fastening portion 20. The second fitting surface 15 and the third fitting surface 22 are both parallel to the third direction z and perpendicular to the second direction y. The movement of the inner frame 2 may be restricted in the second direction y by matching the second fitting surface 15 with the third fitting surface 22. Since the movement of the inner frame 2 is restricted in the third direction z, no abrasion will be caused between the second fitting surface 15 and the third fitting surface 22. Therefore, the second fitting surface 15 and the third fitting surface 22 do not need to be separated or spaced apart as described in the above embodiment to avoid generating the debris caused by the abrasion between the second fitting surface 15 and the third fitting surface 22.

The fastening portion 20 further has a first connecting surface 24, a second connecting surface 25, a third connecting surface 26, and a fourth fitting surface 23 and a fifth fitting surface 27 oppositely disposed. The fourth fitting surface 23 and the fifth fitting surface 27 are respectively connected to opposite ends of the first fitting surface 21. The first connecting surface 24 is connected to the first fitting surface 21 and perpendicular to the first direction x. The second connecting surface 25 is connected to the first connecting surface 24. The second connecting surface 25 is an inclined plane and parallel to the second direction y. The opposite ends of the third connecting surface 26 are respectively connected to the second connecting surface 25 and the third fitting surface 22, and perpendicular to the third direction z.

The positioning portion 10 has a sixth fitting surface and a seventh fitting surface 16 disposed oppositely. The sixth fitting surface and the seventh fitting surface are both formed at the junction of the lateral frame 12 and the bottom frame 13 and are parallel to a plane defined by the first direction x and the third direction z. The sixth fitting surface faces the fourth fitting surface 23, and the seventh fitting surface 16 faces the fifth fitting surface 27.

In one embodiment, as shown in FIG. 4 to FIG. 5, the positioning recess 14 is formed by the outer wall 111a of the bending portion 111 and the second fitting surface 15, the sixth fitting surface, and the seventh fitting surface 16. The cross-section 11 is bent so as not to face the fastening portion 20. When the fastening portion 20 is fitted into the positioning recess 14, it may prevent the cross-section 11 from abasing the fastening portion 20.

In one embodiment, as shown in FIG. 7, the positioning recess 14 is enclosed and formed by the cross-section 11, the second fitting surface 15, the sixth fitting surface, and the seventh fitting surface 16, because the first protective member 4 or the second The protector 5 separates the cross-section 11 from the first fitting surface 21. When the fastening portion 20 is engaged into the positioning recess 14, it can also prevent the cross-section 11 from abasing the fastening portion 20.

As shown in FIG. 4 to FIG. 8, the lateral frame 12 comprises a first side-portion 121, a second side-portion 122, and a connecting portion 123. The first side-portion 121 is connected to the bottom frame 13. The positioning recess 14 is provided at a junction between the first side-portion 121 and the bottom frame 13. The cross-section 11 is formed on the first side-portion 121.

The second side-portion 122 is disposed on an outer periphery of the first side-portion 121. The first side-portion 121 and the second side-portion 122 are both straight-shaped structures and are disposed oppositely in parallel. The connecting portion 123 has an inverted U-shaped structure. The connecting portion 123 is disposed at one end of the first side-portion 121 and the second side-portion 122 away from the bottom frame 13 for connecting the first side-portion 121 and the second side-portion 122.

The first side-portion 121 is integrally formed with the second side-portion 122, the connecting portion 123, and the bottom frame 13. The second side-portion 122 and the connecting portion 123 may be regarded as being formed by bending the lateral frame 12 from a top end of the first lateral portion 121 to an outside of the first lateral portion 121 in a direction opposite to the third direction z. The first side-portion 121 and the second side-portion 122 are used to form a structure of a double-layered lateral frame 12, thereby increasing the rigidity of the lateral frame 12 and preventing the lateral frame 12 from being deformed when receiving an external force.

In summary, the present disclosure discloses a backlight module and an electronic device. The electronic device comprises a display panel and a backlight module. The backlight module comprises an outer frame and an inner frame. The inner frame is disposed inside the outer frame. The outer frame is provided with a positioning portion. A fastening portion is formed on an outer wall of the inner frame. A cross-section of the positioning portion does not directly contact the fastening portion, which may avoid the abrasion of the fastening portion caused by the cross-section of the positioning portion and reduce debris caused by the abrasion between the outer frame and the inner frame at a snap-fit position of the fastening portion and the positioning portion, thereby solving the problem existing in the conventional blacklight module that the inner frame and the outer frame may rub at a snap-fit position, thereby generating the debris.

In summary, although the preferred embodiments of the present disclosure are disclosed as above, the preferred embodiments described above are not intended to limit the present disclosure. Those of ordinary skill in the art can make various kinds of changes and modifications without departing from the concept and scope of the present disclosure. Therefore, the scope of protection of the present disclosure is based on the scope defined by the claims.

What is claimed is:

1. A backlight module, comprising:
an outer frame having a positioning portion, and an inner frame disposed inside the outer frame, wherein a fastening portion is formed on an outer wall of the inner frame, and the fastening portion is in snap-fit engagement with the positioning portion, and wherein the positioning portion has a cross-section, and the cross-section does not directly contact the fastening portion;

wherein the outer frame comprises a lateral frame and a bottom frame, and the lateral frame is disposed on an outer periphery of the bottom frame, and wherein, the positioning portion has a positioning recess, the cross-section is formed on the lateral frame, the positioning recess is at least formed on the lateral frame, and the fastening portion is in snap-fit engagement with the positioning recess;

wherein the lateral frame comprises:
a first lateral portion connected to the bottom frame, wherein the positioning recess is formed at a junction of the first lateral portion and the bottom frame,
a second lateral portion disposed on an outer periphery of the first lateral portion, and
a connecting portion used to connect the first lateral portion and the second lateral portion, wherein the connecting portion is disposed at one end of the first-side portion and the second lateral portion away from the bottom frame.

2. The backlight module according to claim 1, wherein the positioning portion has a bending portion, the fastening portion has a first fitting surface, the first fitting surface faces an outer wall of the bending portion, and the cross-section connects the outer wall of the bending portion.

3. The backlight module according to claim 2, wherein the first fitting surface is perpendicular to a thickness direction of the backlight module, and the cross-section is away from the first fitting surface and is parallel to the first fitting surface.

4. The backlight module according to claim 2, wherein the first fitting surface is perpendicular to a thickness direction of the backlight module, and the cross section is perpendicular to the first fitting surface.

5. The backlight module according to claim 2, wherein the positioning recess is formed at a junction of the lateral frame and the bottom frame, and the positioning portion has a second fitting surface formed on the bottom frame,
wherein, the fastening portion has a third fitting surface facing the second fitting surface, and both the second fitting surface and the third fitting surface are parallel to a thickness direction of the backlight module.

6. The backlight module according to claim 1, wherein the fastening portion has a first fitting surface, the cross-section faces the first fitting surface, and one side of the first fitting surface close to the cross-section is provided with a first protective member.

7. The backlight module according to claim 6, wherein a hardness of the outer frame is greater than a hardness of the inner frame, and a hardness of the first protective member is same as the hardness of the outer frame.

8. The backlight module according to claim 6, wherein the inner frame and the first protective member are formed integrally.

9. The backlight module according to claim 1, wherein the fastening portion has a first fitting surface, the cross-section faces the first fitting surface, and one side of the first fitting surface close to the cross-section is provided with a second protective member.

10. The backlight module according to claim 9, wherein a hardness of the outer frame is greater than a hardness of the inner frame, and a hardness of the second protective member is less than or equal to the hardness of the outer frame.

11. An electronic device, comprising a display panel and a backlight module, wherein the display panel is disposed on the backlight module, and the backlight module comprises:
an outer frame having a positioning portion, and
an inner frame disposed inside the outer frame, wherein a fastening portion is formed on an outer wall of the inner frame, and the fastening portion is in snap-fit engagement with the positioning portion, and wherein the positioning portion has a cross-section, and the cross-section does not directly contact the fastening portion;

wherein the outer frame comprises a lateral frame and a bottom frame, and the lateral frame is disposed on an outer periphery of the bottom frame, and wherein, the positioning portion has a positioning recess, the cross-section is formed on the lateral frame, the positioning recess is at least formed on the lateral frame, and the fastening portion is in snap-fit engagement with the positioning recess;

wherein the fastening portion has a first fitting surface, the cross-section faces the first fitting surface, and one side of the first fitting surface close to the cross-section is provided with a first protective member.

12. The electronic device according to claim 11, wherein the positioning portion has a bending portion, the first fitting surface faces an outer wall of the bending portion, and the cross-section connects the outer wall of the bending portion.

13. The electronic device according to claim 12, wherein the first fitting surface is perpendicular to the backlight module along a thickness direction of the backlight module.

14. The electronic device according to claim 12, wherein the first fitting surface is perpendicular to the backlight module along a thickness direction of the backlight module, and the cross-section is parallel to the first fitting surface.

15. The electronic device according to claim 11, wherein a hardness of the outer frame is greater than a hardness of the inner frame, and a hardness of the first protective member is the same as the hardness of the outer frame.

16. The electronic device according to claim 11, wherein the inner frame and the first protective member are formed integrally.

17. The electronic device according to claim 11, wherein the positioning recess is formed at a junction of the lateral frame and the bottom frame, and the positioning portion has a second fitting surface formed on the bottom frame,
wherein, the fastening portion has a third fitting surface facing the second fitting surface, and both the second fitting surface and the third fitting surface are parallel to a thickness direction of the backlight module.

18. The electronic device according to claim 11, wherein the lateral frame comprises:
a first lateral portion connected to the bottom frame, wherein the positioning recess is formed at a junction of the first lateral portion and the bottom frame,
a second lateral portion disposed on an outer periphery of the first lateral portion, and
a connecting portion used to connect the first lateral portion and the second lateral portion, wherein the connecting portion is disposed at one end of the first-side portion and the second lateral portion away from the bottom frame.

19. The electronic device according to claim 11, wherein one side of the first fitting surface close to the cross-section is provided with a second protective member.

20. A backlight module, comprising:

an outer frame having a positioning portion, and an inner frame disposed inside the outer frame, wherein a fastening portion is formed on an outer wall of the inner frame, and the fastening portion is in snap-fit engagement with the positioning portion, and wherein the positioning portion has a cross-section, and the cross-section does not directly contact the fastening portion;

wherein the outer frame comprises a lateral frame and a bottom frame, and the lateral frame is disposed on an outer periphery of the bottom frame, and wherein, the positioning portion has a positioning recess, the cross-section is formed on the lateral frame, the positioning recess is at least formed on the lateral frame, and the fastening portion is in snap-fit engagement with the positioning recess;

wherein the positioning portion has a bending portion, the fastening portion has a first fitting surface, the first fitting surface faces an outer wall of the bending portion, and the cross-section connects the outer wall of the bending portion; and wherein the first fitting surface is perpendicular to a thickness direction of the backlight module, and the cross section is perpendicular to the first fitting surface.

* * * * *